(12) United States Patent
Wang et al.

(10) Patent No.: US 8,952,463 B2
(45) Date of Patent: Feb. 10, 2015

(54) MEMS STRUCTURE PREVENTING STICTION

(75) Inventors: Chuan-Wei Wang, Hsin-Chu (TW); Sheng-Ta Lee, Hsin-Chu (TW); Hsin-Hui Hsu, Hsin-Chu (TW)

(73) Assignee: Pixart Imaging Incorporation, Hsin-Chu (TW)

( * ) Notice: Subject to any disclaimer, the term of this patent is extended or adjusted under 35 U.S.C. 154(b) by 450 days.

(21) Appl. No.: 12/800,829

(22) Filed: May 24, 2010

(65) Prior Publication Data

US 2010/0258885 A1 Oct. 14, 2010

Related U.S. Application Data

(63) Continuation-in-part of application No. 12/217,732, filed on Jul. 8, 2008, now Pat. No. 8,003,422.

(30) Foreign Application Priority Data

Jan. 8, 2010 (TW) ................................ 99200397 U

(51) Int. Cl.
*H01L 27/14* (2006.01)
*B81B 3/00* (2006.01)

(52) U.S. Cl.
CPC ....................................... *B81B 3/001* (2013.01)
USPC ...................... 257/414; 438/50; 257/E29.324

(58) Field of Classification Search
USPC .................. 257/E29.324, E21.613, 414–420; 438/50, 52
See application file for complete search history.

(56) References Cited

U.S. PATENT DOCUMENTS

| | | | |
|---|---|---|---|
| 6,238,580 B1 | 5/2001 | Cole et al. | |
| 6,249,073 B1 | 6/2001 | Nguyen et al. | |
| 6,490,147 B2 | 12/2002 | Yoon et al. | |
| 6,576,489 B2 * | 6/2003 | Leung et al. | 438/52 |
| 6,707,593 B2 | 3/2004 | Le et al. | |
| 6,949,866 B2 | 9/2005 | Miller et al. | |
| 2007/0218630 A1 * | 9/2007 | Yamaguchi et al. | 438/257 |
| 2007/0269920 A1 | 11/2007 | Yu et al. | |
| 2008/0048520 A1 | 2/2008 | Gulvin et al. | |
| 2009/0033718 A1 * | 2/2009 | Faase et al. | 347/54 |
| 2009/0135463 A1 * | 5/2009 | Miles | 359/290 |
| 2010/0002895 A1 * | 1/2010 | Notake et al. | 381/174 |
| 2010/0065930 A1 * | 3/2010 | Nakatani | 257/415 |
| 2011/0019380 A1 * | 1/2011 | Miles | 361/783 |

* cited by examiner

*Primary Examiner* — Sonya D McCall Shepard
(74) *Attorney, Agent, or Firm* — Tung & Associates

(57) ABSTRACT

A MEMS (Micro-Electro-Mechanical-System) structure preventing stiction, comprising: a substrate; and at least two structural layers above the substrate, wherein at least one of the at least two structural layers is a movable part, and anyone or more of the at least two structural layers is provided with at least one bump to prevent the movable part from sticking to another portion of the MEMS structure.

15 Claims, 6 Drawing Sheets

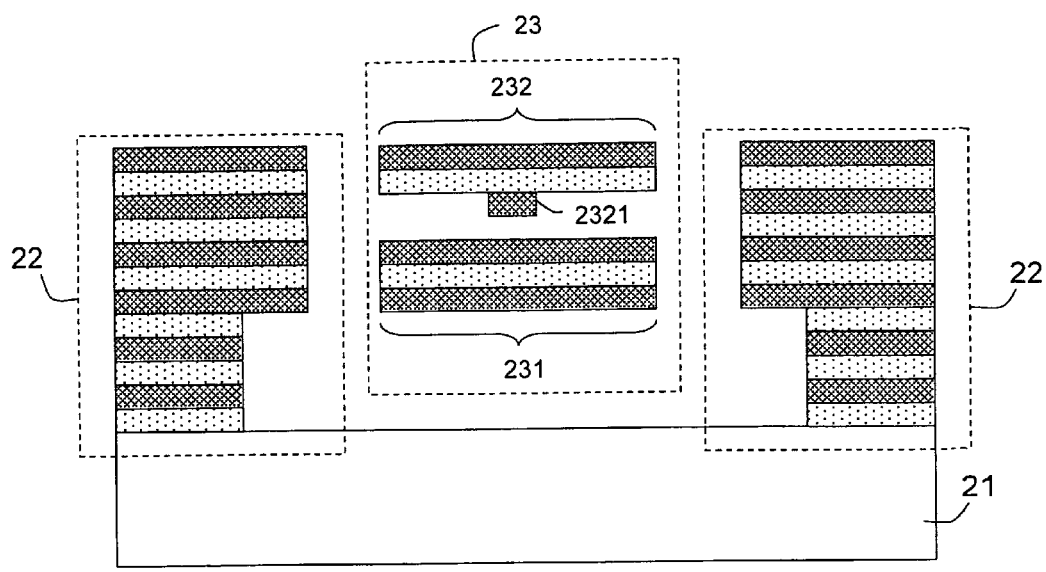
Fig. 3
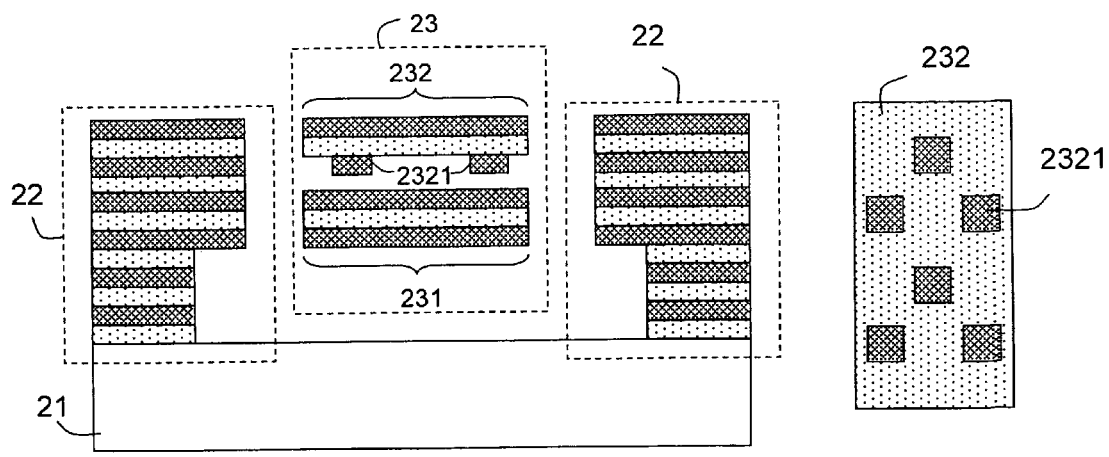
Fig. 4  Fig. 4A

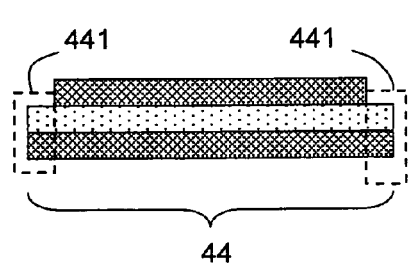
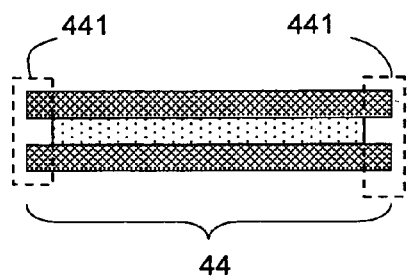
Fig. 11　　　　　Fig. 12
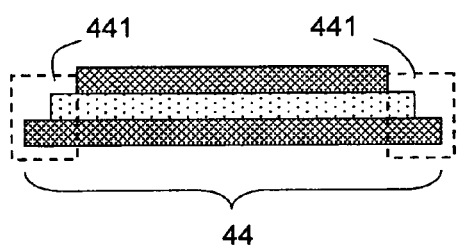
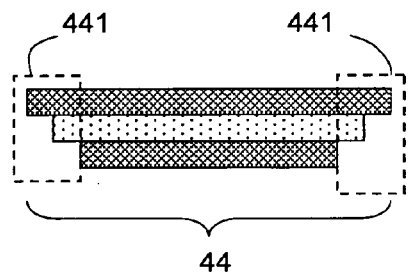
Fig. 13　　　　　Fig. 14
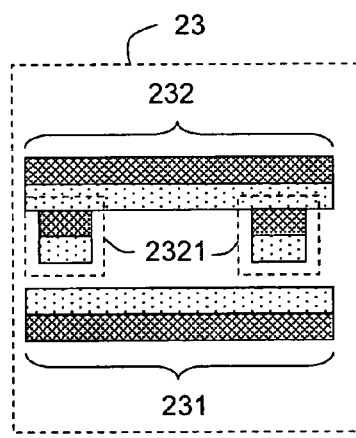
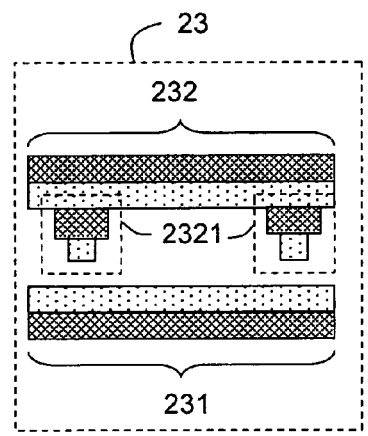
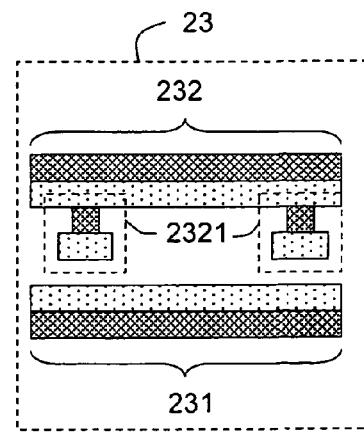
Fig. 15　　Fig. 16　　Fig. 17

MEMS STRUCTURE PREVENTING STICTION

CROSS REFERENCE TO RELATED APPLICATIONS

This application is a continuation-in-part of U.S. patent application Ser. No. 12/217,732, filed on Jul. 8, 2008, now U.S. Pat. No. 8,003,422 and claims priority to Taiwanese Patent 099200397, filed on Jan. 8, 2010.

FIELD OF INVENTION

The present invention relates to a MEMS structure with a function for preventing stiction.

BACKGROUND OF THE INVENTION

MEMS (Micro-Electro-Mechanical System) devices are used in a wide variety of products; for example, it can be used to form an accelerometer or the like. In manufacture or operation of a MEMS device, a phenomenon called "stiction" may occur because of stress or other reasons. U.S. Ser. No. 12/217,732 (published as US 2009/0273043) which is assigned to the same assignee of the present application and based on which the present application is a continuation-in-part, describes such stiction in its FIG. 1H, which is shown in a simplified form as FIG. 1 of the present application. Referring to FIG. 1, a structural layer 11 is deformed due to stress, so it sticks to a nearby structural layer 12 and causes the device unable to operate normally. Such stiction may occur during manufacture or operation of a MEMS device. Thus, it is desired to solve this problem.

SUMMARY OF THE INVENTION

An objective of the present invention is to provide a MEMS structure with a function for preventing stiction, to solve the aforementioned problem.

To achieve the foregoing objective, in one perspective of the present invention, it provides a MEMS structure with a function for preventing stiction, comprising: a substrate; and at least two structural layers above the substrate, wherein at least one of the at least two structural layers is a movable part, and anyone or more of the at least two structural layers is provided with at least one bump to prevent the movable part from sticking to another portion of the MEMS structure.

In the foregoing MEMS structure, the at least one bump may be provided above, below, or aside one of the at least two structural layers. The at least one bump may be aligned in arrays or arranged irregularly. The at least one bump preferably has a size equal to or smaller than 0.25 $\mu m^2$.

In the foregoing MEMS structure, two or more of the at least two structural layers can be provided with the at least one bump.

When the at least one structural layer provided with the bump is a composite layer including at least two layers, the bump may be a multi-layer structure.

The objectives, technical details, features, and effects of the present invention will be better understood with regard to the detailed description of the embodiments below, with reference to the drawings.

BRIEF DESCRIPTION OF THE DRAWINGS

FIGS. 3-4 show two other embodiments of the present invention.
FIG. 4A illustrates another way to arrange the bumps.
FIGS. 11-14 illustrate several embodiments of the bump 441.
FIGS. 15-17 illustrate several embodiments wherein the bumps are located above or below the structural layer.

DESCRIPTION OF THE PREFERRED EMBODIMENTS

The drawings as referred to throughout the description of the present invention are for illustration only, to show the interrelationships between the process steps and between the layers, but not drawn according to actual scale.

The present invention is characterized in that: at least one bump is provided between two structural parts of the MEMS device to avoid stiction during manufacture or operation of the MEMS device. In the latter condition (to avoid stiction during operation of the MEMS device), one of the two structure parts is a movable part, and the other structure part can be either a movable part or a fixed part. In the former condition (to avoid stiction during manufacture of the MEMS device is formed), it is not necessary for one or more of the two structure parts to be movable. The bump preferably has (but is not limited to) a size equal to or smaller than 0.25 $\mu m^2$.

Figure 1:
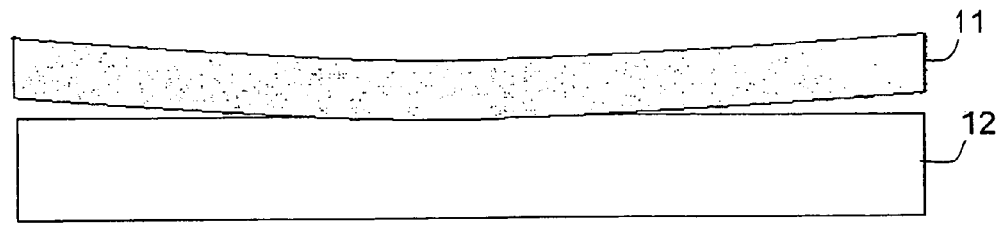
FIG. 1 shows a stiction issue in prior art.
Figure 2:
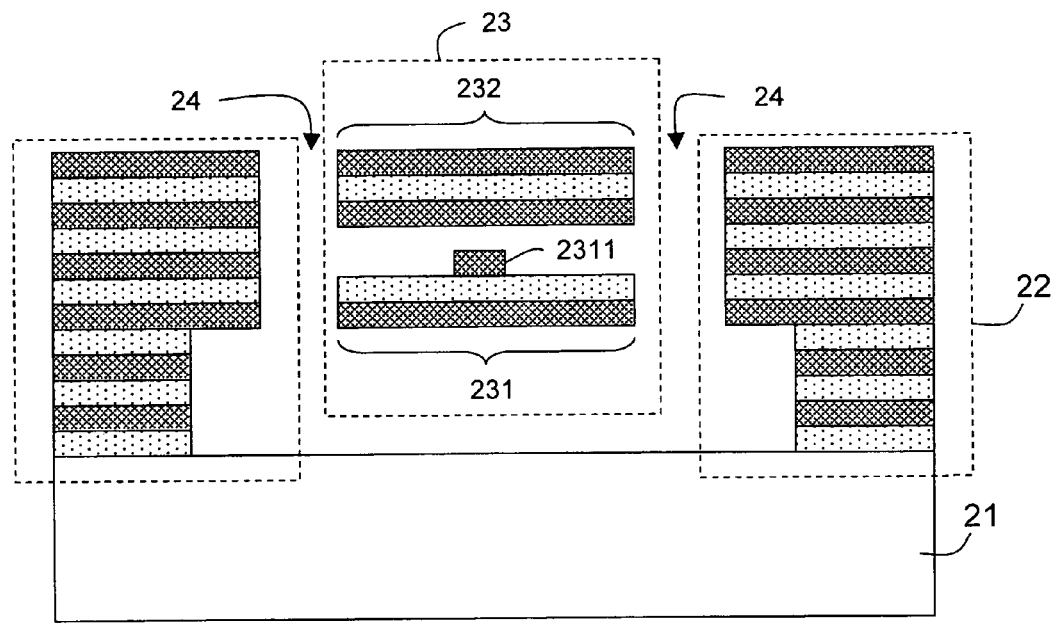
FIG. 2 shows an embodiment of the present invention.
Figure 2A:
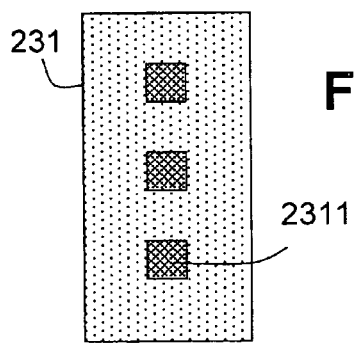
FIGS. 2A-2B illustrate, by way of example, two arrangements of the bumps.
Figure 2B:
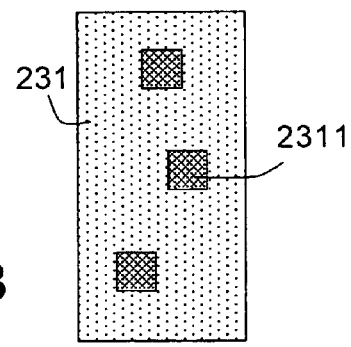

Referring to FIG. 2, an out-of-plane sensor is taken as one example. The MEMS device includes a substrate 21, a capacitive sensor device 23 on the substrate, and other structural parts 22 of the MEMS device (which may be, e.g., anchors or an isolation wall). For details of an out-of-plane sensor, please refer to U.S. Pat. Nos. 6,402,968, 6,792,804, 6,845,670, 7,138,694, or 7,258,011; the operation and application of an out-of-plane sensor are not described here because they are not the essence of the present invention. The capacitive sensor device 23 includes a lower structural layer 231 (forming a lower electrode plate) and an upper structural layer 232 (forming an upper electrode plate). When the MEMS device is moved which causes a change of the distance between the upper and lower electrode plates, a displacement of the MEMS device can be calculated according to the change of the capacitance. In this embodiment, a bump or bumps 2311 are provided above the lower structural layer 231. Thus, when the two structural layers 231 and 232 are moved relatively to each other, or in manufacture, no stiction will occur. The number and spatial arrangement of the bump or bumps 2311 can be determined according to the sizes of the two structural layers 231 and 232. From top view, the bumps 2311 for example can be aligned in one line as shown in FIG. 2A, or arranged irregularly as shown in FIG. 2B.

The bump or bumps 2311 can be formed by lithography and etch which are standard process steps in a CMOS (Complementary Metal-Oxide-Silicon) manufacturing process. For example, the structural parts 22 and sensor device 23 may be formed by metal, and the space indicated by the arrows 24 may originally be sacrificial layers made of oxide. The structural parts 22, sensor device 23 and the oxide sacrificial layers are formed during the CMOS manufacturing process in a manner similar to that for forming interconnection of a CMOS electronic circuit. After the structural parts 22, sensor device 23 and the oxide sacrificial layers are formed, an etch step is taken, such as HF (Hydrogen Fluoride) vapor etch, to remove the oxide sacrificial layers and to create the space 24 such that the sensor device 23 is released, i.e., becomes movable.

Alternatively, a bump or bumps 2321 can be provided below the upper structural layer 232 as shown in FIG. 3, which can achieve similar function as the previous embodiment. FIG. 4 shows that the bumps 2321 can be aligned in two or more lines, not limited to only one single line. FIG. 4A is a bottom view which shows that the bumps 2321 can be aligned in an alternative arrangement of single and dual lines. Certainly, the bumps 2321 can also be arranged irregularly.

All the foregoing embodiments are applied to out-of-plane sensors, wherein the movable part is moved vertically; hence, the bump is preferably provided above or below the structural layer. The present invention can also be applied to a MEMS device wherein its movable part is moved in horizontal direction, such as an in-plane sensor. Please refer to FIG. 5, which is one example of the in-plane sensor. In this embodiment, the in-plane sensor 100 includes fixed electrodes 43, movable electrodes 44, springs 46, anchors 48, and checkers 42. When a distance between a movable electrode 44 and a fixed electrode 43 is changed, a displacement of the MEMS part can be determined according to a change of the capacitance therebetween. For details of an in-plane sensor, please refer to U.S. Pat. Nos. 5,326,726, 5,847,280, 5,880,369, 6,877,374, 6,892,576, and U.S. Patent Publication 2007/0180912; the operation and application of an in-plane sensor are not described here because they are not the essence of the present invention. In this embodiment, bumps 421 and 441 are provided aside the checkers 42 and the movable electrodes 44 respectively, such that no stiction will occur when the movable electrodes 44 are moved horizontally. Certainly, it is possible to provide the bumps for only one, not both, of the checkers 42 and the movable electrodes 44 (only bumps 421 or only bumps 441).

Figure 5:
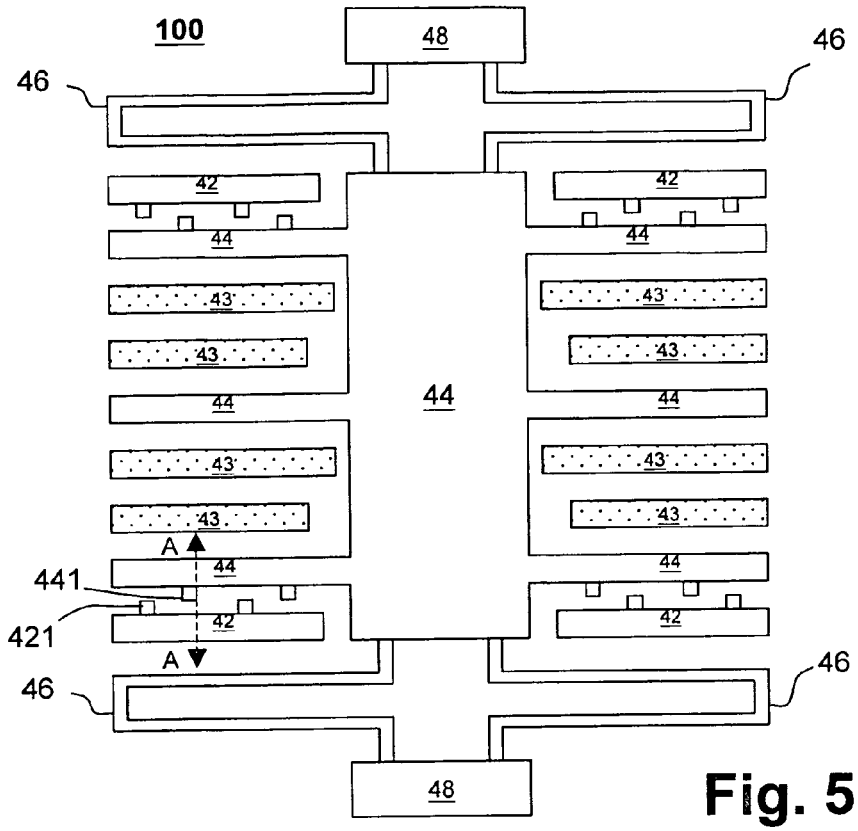
FIG. 5 shows another embodiment of the present invention, wherein the bumps are provided in the horizontal plane.
Figure 6:
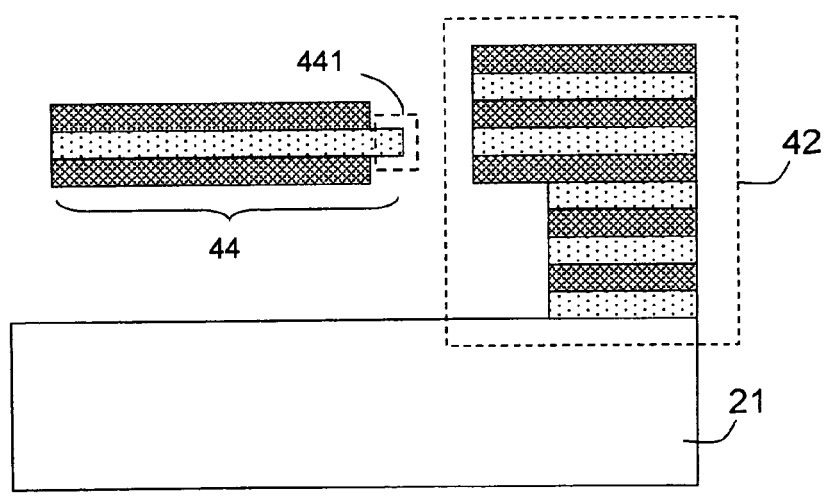
FIG. 6 is a cross-section diagram along a cross-section line A-A in FIG. 5.

FIG. 6 is a cross-section diagram along a cross-section line A-A in FIG. 5. The movable electrode 44 shown in this embodiment is formed by a composite layer including at least two layers. As shown in the drawing, the bump 441 is not required to cover the entire composite layer (i.e., in this embodiment, the bump is not required to have three layers); the bump 441 can be formed by just one of the layers, extruding therefrom. Certainly, it still falls within the scope of the present invention if multiple or all of the layers extrude to form one or more bumps, wherein the extrusions of multiple layers are not required to be in alignment.

Figure 7:
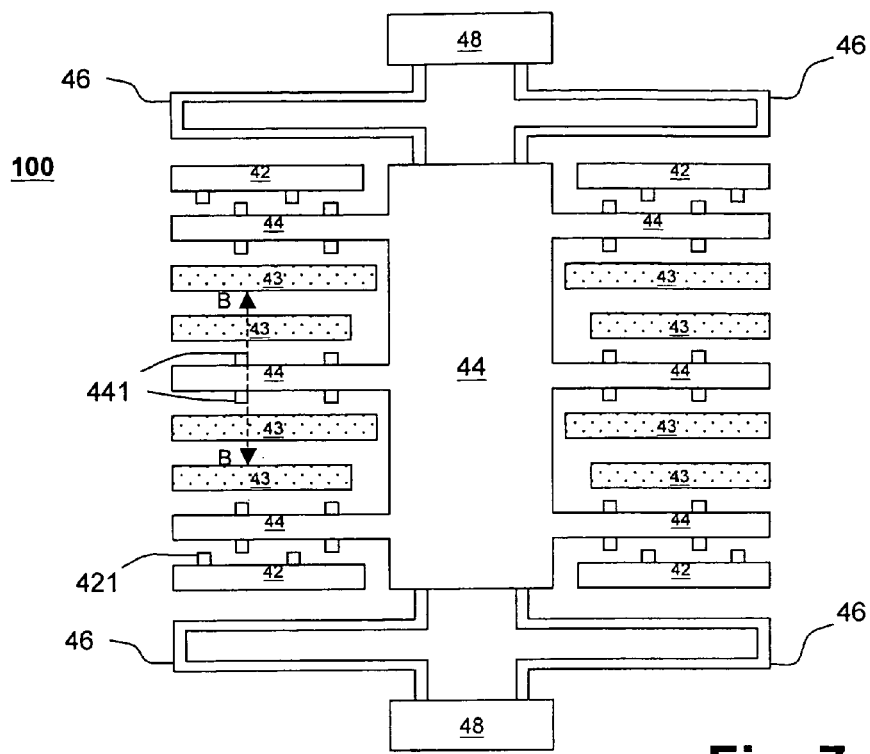
FIG. 7 shows another embodiment of the present invention, wherein the bumps are provided in the horizontal plane.
Figure 8:
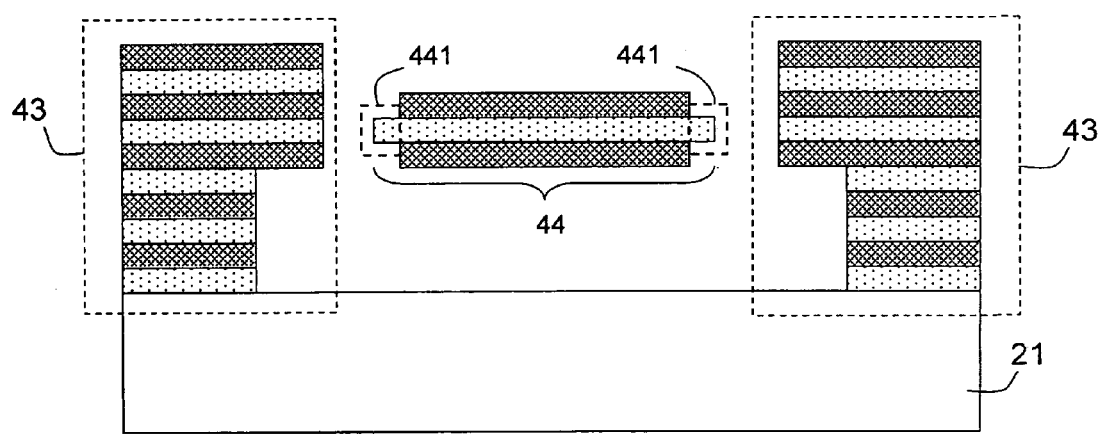
FIG. 8 shows a cross-section diagram along a cross section line B-B in FIG. 7.

FIG. 7 shows another embodiment in which the bumps are provided in the horizontal plane. In this embodiment, additional bumps 441 are provided at one side of each movable electrode 44 at locations between the movable electrodes 44 and the fixed electrodes 43, other than between the checkers 42 and the movable electrodes 44. FIG. 8 shows a cross-section diagram along a cross-section line B-B in FIG. 7.

Figure 9:
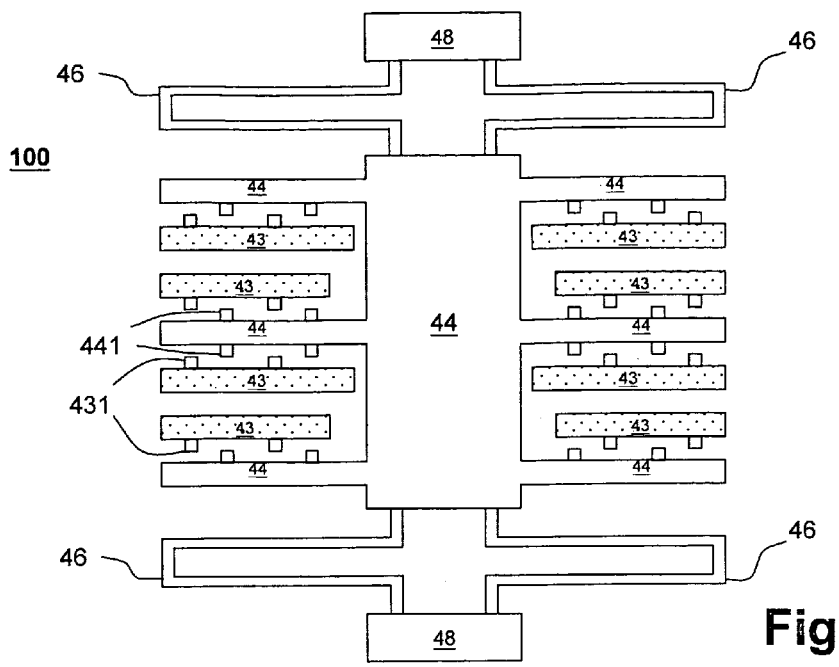
FIGS. 9 and 10 show two other embodiments without checkers 42.
Figure 10:
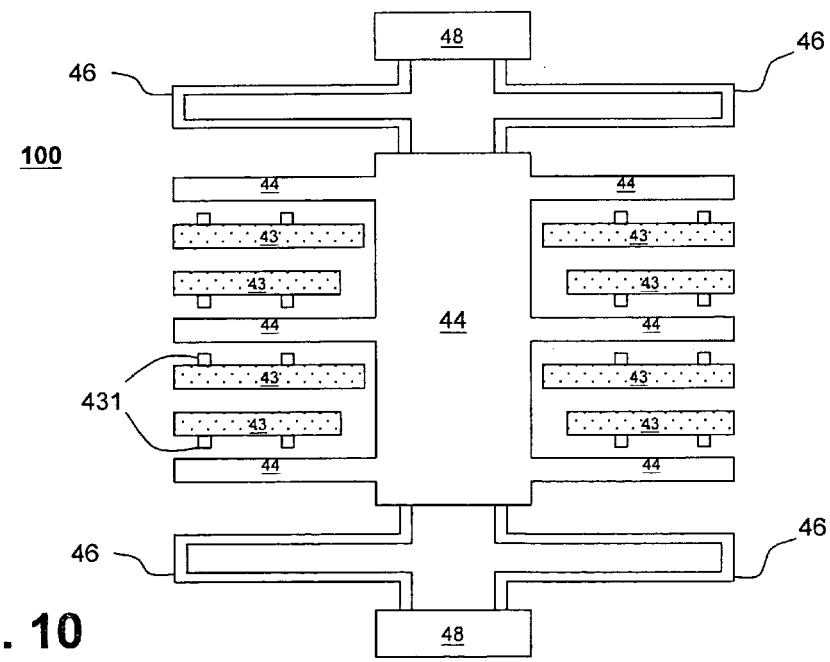

In the foregoing embodiments, the checkers 42 are not necessarily required. FIGS. 9 and 10 show two other embodiments without the checkers 42. In FIG. 9, the bumps 441 and 431 are provided aside both of the movable electrodes 44 and the fixed electrodes 43 at locations between the movable electrodes 44 and the fixed electrodes 43. In FIG. 10, the bumps 431 are provided only aside the fixed electrodes 43, at locations between the movable electrodes 44 and the fixed electrodes 43.

When the structural part provided with the bump is a composite layer including at least two layers, the bump can be provided at anyone or more of the at least two layers of the composite layer and it can be of any structure. For example, FIGS. 11-14 illustrate several possible embodiments of the bump 441. Similarly, when the bump is provided above or below the structural layer, it can be embodied by various forms, such as those shown in FIGS. 15-17. The above and other modifications and variations shall fall within the scope of the present invention.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the number of layers and the applications of the MEMS device described in the foregoing embodiments are for illustration only; various other modifications and variations are possible. In view of the foregoing, the spirit of the present invention should cover all such and other modifications and variations, which should be interpreted to fall within the scope of the following claims and their equivalents.

What is claimed is:

1. A MEMS (Micro-Electro-Mechanical-System) structure preventing stiction, comprising:
    a substrate; and
    at least two structural layers above the substrate, wherein at least one of the at least two structural layers is a movable part, and one or more of the at least two structural layers is provided with at least one bump to prevent the movable part from sticking to another portion of the MEMS structure, the at least one bump protruding toward a horizontally lateral direction and being provided at a horizontally lateral side of the one or more of the at least two structural layers, wherein the horizontally lateral direction is a direction in parallel to an upper surface of the substrate.

2. The MEMS structure of claim 1, wherein both of the at least two structural layers are provided with the at least one bump.

3. The MEMS structure of claim 1, wherein there are multiple bumps aligned in arrays.

4. The MEMS structure of claim 1, wherein there are multiple bumps arranged not regularly.

5. The MEMS structure of claim 1, wherein each of the at least one bump has a size equal to or smaller than 0.25 $\mu m^2$.

6. The MEMS structure of claim 1, wherein the at least one structural layer provided with the bump is a composite layer including at least two layers, and the bump is a single-layer structure.

7. The MEMS structure of claim 1, wherein the at least one structural layer provided with the bump is a composite layer including at least two layers, and the bump is a multi-layer structure.

8. The MEMS structure of claim 1, wherein the at least one structural layer provided with the bump is the movable part.

9. The MEMS structure of claim 1, wherein the at least one structural layer provided with the bump is not the movable part.

10. The MEMS structure of claim 1, wherein the movable part becomes movable after a hydrogen fluoride vapor etch step which creates a space between the at least two structural layers.

11. The MEMS structure of claim 10, wherein oxide sacrificial layers are formed between the at least two structural layers, and wherein the hydrogen fluoride vapor etch step removes the oxide sacrificial layers.

12. A MEMS (Micro-Electro-Mechanical-System) structure preventing stiction, comprising:
   a substrate; and
   at least two structural layers above the substrate, wherein at least one of the at least two structural layers is a movable part, and one of the at least two structural layers is provided with multiple bumps to prevent the movable part from sticking to another portion of the MEMS structure, the multiple bumps being arranged not regularly, wherein the multiple bumps are at a different layer from the structural layer which is provided with the multiple bumps.

13. The MEMS structure of claim 12, wherein only one of the at least two structural layers is provided with the multiple bumps.

14. The MEMS structure of claim 12, wherein the one structural layer provided with the bump is a composite layer including at least two layers, and the bump is a single-layer structure.

15. The MEMS structure of claim 12, wherein the one structural layer provided with the bump is a composite layer including at least two layers, and the bump is a multi-layer structure.

* * * * *